United States Patent [19]

Soyuer

[11] Patent Number: 5,113,153
[45] Date of Patent: May 12, 1992

[54] HIGH-FREQUENCY MONOLITHIC OSCILLATOR STRUCTURE FOR THIRD-OVERTONE CRYSTALS

[75] Inventor: Mehmet Soyuer, Mohegan Lake, N.Y.

[73] Assignee: International Business Machines Corporation, Armonk, N.Y.

[21] Appl. No.: 703,232

[22] Filed: May 20, 1991

[51] Int. Cl.⁵ .............................................. H03B 5/36
[52] U.S. Cl. ........................................ 331/61; 331/75; 331/116 R; 331/158
[58] Field of Search ................ 331/61, 74, 75, 116 R, 331/116 FE, 158, 159, 108 D

[56] References Cited

U.S. PATENT DOCUMENTS

| | | | |
|---|---|---|---|
| 2,796,522 | 6/1957 | Greenspan et al. | 331/159 X |
| 3,054,967 | 9/1962 | Gindi | 331/75 |
| 3,378,790 | 4/1968 | Bray | 331/116 R |
| 3,699,476 | 10/1972 | Mancini | 331/116 R |
| 4,039,973 | 8/1977 | Yamashiro | 331/116 R |
| 4,297,654 | 10/1981 | Goerth | 331/108 D |
| 4,600,899 | 7/1986 | Kennedy | 331/116 R |
| 4,710,731 | 12/1987 | Sugita et al. | 331/158 |
| 4,864,256 | 9/1989 | Barnert | 331/116 R |

*Primary Examiner*—Siegfried H. Grimm
*Attorney, Agent, or Firm*—John J. Goodwin

[57] ABSTRACT

A crystal oscillator circuit wherein first and second transistors are connected to form a differential pair. The second transistor functions as an inverting gain stage for the oscillator and two capacitors are provided to complete a feedback path in series with a crystal which essentially functions as an inductor. The capacitors are large enough to minimize the effect of device parasitics and small enough for monolithic implementation. The square-wave output from the circuit is completely isolated from the oscillator gain stage, thus subsequent logic gates will not have any effect on the oscillator performance and DC-coupling can be used without a need for AC-coupling capacitors. The circuit is completely monolithic, requiring only an external crystal. The circuit inherently suppresses the fundamental frequency without a need for a tank circuit or a feedback resistor and does not influence the biasing. The circuit has a completely isolated square-wave output in addition to a sinusoidal output, and reliable high frequency operation with a third-overtone crystal is possible at frequencies from 35 MHz to 70 MHz.

4 Claims, 1 Drawing Sheet

HIGH-FREQUENCY MONOLITHIC OSCILLATOR STRUCTURE FOR THIRD-OVERTONE CRYSTALS

BACKGROUND OF THE INVENTION

1. Field of the Invention

The present invention relates to crystal oscillator circuits for generating high-frequency signals, and more particularly to a high-frequency monolithic third-overtone crystal oscillator circuit with inherent fundamental frequency suppression.

2. Description of the Prior Art

U.S. Pat. No. 4,600,899, issued July 15, 1986 to Kennedy, entitled DUAL MODE CRYSTAL PHASE SHIFT TRANSISTOR OSCILLATOR, discloses an oscillator that comprises an amplifier with a feedback loop from the output to the input thereof, the feedback loop including a resonator such as a crystal providing oscillation of the amplifier at a predetermined frequency. A balanced modulator coupled to the amplifier generates a voltage varying at the same frequency, said voltage being selectably variable in amplitude from zero upward either in phase with the amplifier or 180 degrees out of phase therewith. The voltage is selectably inserted into the feedback loop 90 degrees out of phase with the output of the amplifier, whereby, when it is inserted, the frequency of oscillation of the amplifier varies from the predetermined frequency in direction depending upon the phase relationship of the amplifier and voltage and in amount upon the amplitude of the voltage.

The patent describes how to make a voltage-controlled oscillator from a crystal-controlled oscillator. There is no mention of whether the crystal oscillator can be used in third-overtone applications. It is restricted to the crystal oscillators in the fundamental mode and its innovative part is that it can also be used as a voltage-controlled oscillator by means of additional circuitry.

U.S. Pat. No. 3,054,967, issued Sept. 18, 1962 to Gindi, entitled FREE-RUNNING PULSE GENERATOR FOR PRODUCING STEEP EDGE OUTPUT PULSES, discloses pulse generators which employ transistors for developing substantially rectangular output pulses at a preselected repetition rate and which have steep edge portions for precise timing purposes at frequencies above one megacycle. This patent uses inductors and transformer to select the right frequency of operation. One of the essential features of the applicant's invention is the avoidance of such inductive components for the frequency selection.

U.S. Pat. No. 4,297,654, issued Oct. 27, 1981 to Goerth, entitled CRYSTAL OSCILLATOR INCLUDING A MOS-CAPACITOR, discloses a semiconductor element having a MOS-capacitor between a zone provided in an epitaxial layer on a substrate and a conductive layer on an insulating layer above the zone is utilized in a structure comprising a tunable oscillator having a differential amplifier, a current distributor controlled by a control voltage, a phase shifting element comprising the MOS-capacitor and a feedback path present between the phase shifting element and an input of the differential amplifier. The feedback path comprises a quartz oscillator and an emitter-follower transistor. The stray capacitor between the zone and a substrate of the opposite conductivity type is considerably reduced by a further zone of the opposite conductivity type which is applied to a fixed potential through a connection electrode. This connection point is for the supply voltage of the circuit, while the further zone of the first conductivity type is connected parallel to the emitter-base current path of the emitter-follower transistor.

This patent describes how to reduce the parasitic effects on an on-chip MOS-capacitor which can be used in integrated circuits such as any oscillator circuit in monolithic form. It is more related to the semiconductor device physics and integration rather than to the field of crystal oscillator circuit design.

U.S. Pat. No. 2,796,522, issued June 18, 1957 To Greenspan et al, entitled CRYSTAL-CONTROLLED RELAXATION OSCILLATOR, relates to relaxation oscillators and in particular to a method and apparatus for stabilizing the frequency of relaxation oscillators by means of a piezoelectric crystal. The oscillator includes a multivibrator, the output frequency of which is synchronized with a harmonic or subharmonic of a piezoelectric crystal. The piezoelectric crystal is coupled into the grid circuit of the multivibrator, the crystal and tube acting as a crystal oscillator immediately prior to the firing of the tube in whose grade circuit the crystal is coupled. In addition to the crystal oscillator, the circuit resonates as a low-Q amplitude-unstable oscillator, whose frequency is locked on some harmonic or subharmonic of the crystal frequency. Because the low-Q oscillator is amplitude unstable, successive oscillations of this circuit will produce output voltages of increasing amplitude, the firing of the tubes of the multivibrator being controlled by one of these voltage peaks. Since the amplitude of these peaks is increasing rapidly, particularly during the prior just before firing, the circuit can easily differentiate between successive voltage peaks. This patent describes a relaxation oscillator which can be made more stable in frequency by addition of a crystal. A relaxation oscillator is a low-Q regenerative circuit whose behavior is entirely different from a crystal oscillator which has extremely high-Q. It is an attempt to improve the poor stability of relaxation oscillators.

U.S. Pat. No. 4,864,256, issued Sept. 5, 1989 to Barnert, entitled OSCILLATOR WITH REDUCED HARMONICS, discloses an oscillator for producing an oscillating signal with reduced harmonics including an oscillator stage coupled to an output stage having a relatively fast switching speed yet producing an oscillating signal having relatively slow rise and fall times so that the harmonics output by the oscillator are reduced. In one embodiment, the oscillator includes an output stage having low power Schottky circuitry, and in a second embodiment, the output stage includes a capacitor connected across the output stage of the oscillator to increase the rise and fall times of the oscillator. The patent addresses the problem of how to reduce the unwanted harmonics produced by the sharp (fast) transitions of the oscillator input. Therefore, the design is mainly concerned with the output buffer stage (not the oscillator itself) which serves as a means of slowing down the oscillator output transitions.

U.S. Pat. No. 4,710,731, issued Dec. 1, 1987 to Sugita et al, entitled PLANAR TYPE THICKNESS SHEAR MODE QUARTZ OSCILLATOR, describes a planar type thickness shear mode quartz resonator which can be operated by an oscillation circuit free of any coils or condensers in the tuning circuit and in which the ratio between the diameter and the thickness of the resonator is so designed as to yield stable oscillation in the third-overtone. The difference between the negative resistance of the oscillation circuit and the crystal impedance of the quartz resonator is greater in the third-overtone than the difference in other oscillation modes.

The circuit shown in this patent does not include a feedback resistor for overtone selection because the whole point of this patent is the design of a special crystal device (not a crystal oscillator) which has a strong third-overtone response (in other words, the crystal loss in the third-overtone mode is hopefully less than the negative resistance provided by the oscillator circuit to which it is connected). The patent tries to achieve this by careful design of the thickness and the diameter of the crystal device. This approach is going to fail if the oscillator circuit itself is not designed properly to provide enough negative resistance.

U.S. Pat. No. 4,039,973, issued Aug. 2, 1977 to Yamashiro, entitled INITIATION CIRCUIT IN A CRYSTAL-CONTROLLED OSCILLATOR, discloses that in a crystal-controlled oscillator circuit comprising a complementary-MOS inverter provided with a crystal in the feedback circuit, an initiation circuit is provided which comprises another complementary-MOS inverter connected in parallel to said MOS inverter only at the time of initiation. This oscillator circuit includes a parallel circuit connection of two complementary-MOS inverters at the time of initiation and hence has a large driving power and a short oscillation initiation time. Because of rendering one complementary-MOS inverter to be cut off at a time of normal oscillation, the power consumption is reduced.

This patent is restricted to a crystal-oscillator start-up (initiation) circuit. The innovation in this patent is the MOS inverter which provides the desired speed-up during the oscillator initiation (start-up) which may otherwise take long in CMOS (complementary-MOS) crystal oscillator implementations.

U.S. Pat. No. 3,699,476, issued Oct. 17, 1972 to Mancini, entitled CRYSTAL CONTROLLED DIGITAL LOGIC GATE OSCILLATOR, discloses a high frequency crystal-controlled oscillator circuit which utilizes a digital logic gate in an amplifier mode of operation and produces sine or square wave output signals.

This patent essentially describes a conventional Pierce oscillator. A resistor and an inductor are added in series to suppress the spurious oscillations and to enable the coupling of the logic gates with the crystal which is the innovation in this patent.

SUMMARY OF THE INVENTION

An object of the present invention is to provide a crystal oscillator circuit that is fabricated as completely monolithic, requiring only an external crystal.

Another object of the present invention is to provide a crystal oscillator circuit which inherently suppresses the fundamental frequency without a need for a tank circuit and does not influence the biasing.

A still further object of the present invention is to provide a crystal oscillator circuit which has a completely isolated square-wave output in addition to a sinusoidal output, and reliable high frequency operation with a third-overtone crystal at frequencies from 35 MHz to 70 MHz.

DESCRIPTION OF THE PREFERRED EMBODIMENT

Figure 1:
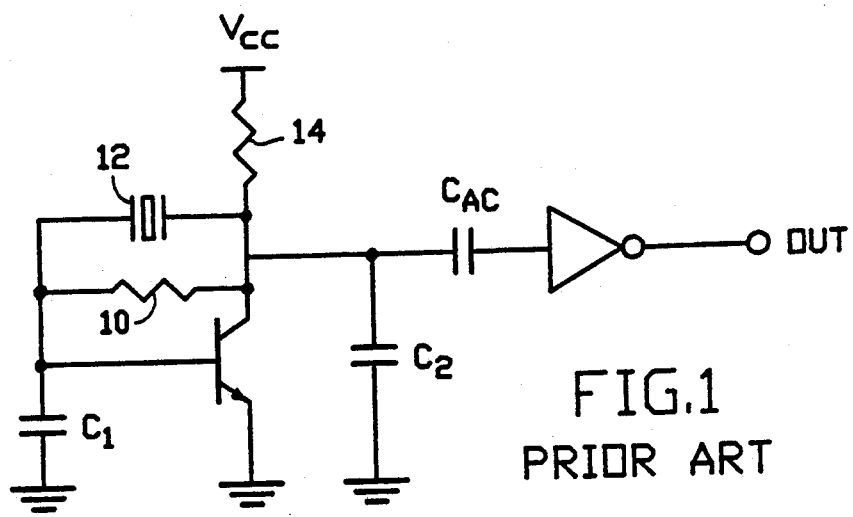
FIG. 1 is a schematic illustration of a prior art oscillator circuit used in describing the present invention.

Crystal oscillator are widely used to generate reference clock frequencies in various electronic systems. The prior art Pierce oscillator shown in FIG. 1 is commonly used with third-overtone crystals. The feedback resistor 10 connected in shunt with crystal 12 is used both for biasing and fundamental frequency suppression. Resistor 10 must be small enough to cancel any negative resistance seen by crystal 12 at the fundamental frequency and large enough to oscillations to start at the third-overtone frequency. The output loading has a strong effect on the circuit performance due to poor isolation. Furthermore, the transistor bias current is a strong function of resistors 10 and 14 and the transistor parameters which can easily result in an unstable design especially at higher frequencies. Finally, the circuit of FIG. 1 is not suitable for monolithic integration due to large coupling capacitor and strong dependence of bias levels on the absolute resistor values.

Figure 2:
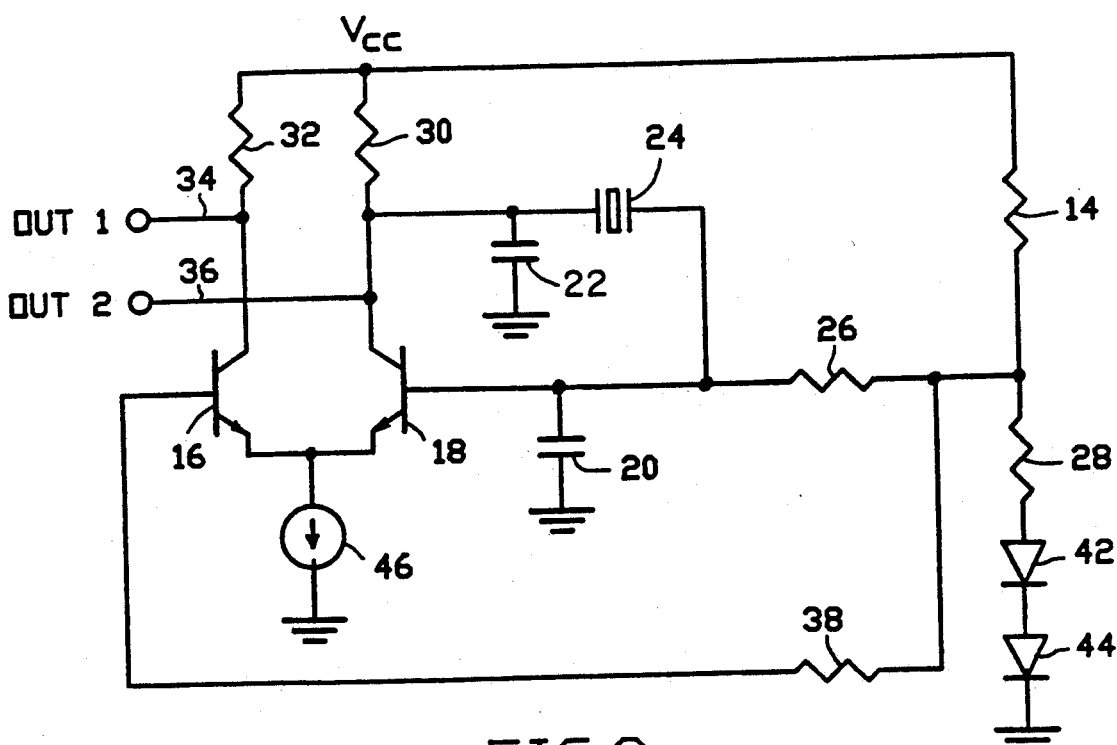
FIG. 2 is a schematic illustration of an embodiment of a crystal oscillator circuit according to the principles of the present invention.

The present invention, an embodiment which is shown in FIG. 2, is a crystal oscillator circuit wherein first and second transistors are connected to form a differential pair. The second transistor functions as an inverting gain stage for the oscillator and two capacitors are provided to complete a feedback path in series with a crystal which essentially functions as an inductor. The capacitors are designed to be large enough to minimize the effect of device parasitics and small enough for monolithic implementation.

The square wave output from the circuit is completely isolated from the oscillator gain stage, thus subsequent logic gates will not have any effect on the oscillator performance and DC-coupling can be used without a need for AC-coupling capacitors.

More particularly, in the circuit configuration shown in FIG. 2, transistor 16 and transistor 18 form a differential pair. Transistor 18 acts as an inverting gain stage for the oscillator. Capacitors 20 and 22 complete the feedback path in series with the crystal 24 which essentially acts as an inductor. These capacitors 20 and 22 must be large enough to minimize the effect of device parasitics and small enough (a total of 30 pF or less) for monolithic implementation. It can theoretically be shown that the minimum frequency above which the crystal sees a negative resistance is given by:

$$f_{min} \approx \frac{1}{2\pi \sqrt{R_1 C_1 R_2 C_2}}$$

where resistances $R_1$ and $R_2$ are the equivalent AC resistances seen by capacitors 20 and 22 respectively. For example, if the capacitors 20 and 22 are chosen to be 10 pF each and $R_1$ is 1 Kohm and $R_2$ is 400 ohm, $f_{min}$ will be 25 MHz. This implies that the circuit will provide fundamental-mode suppression for third-overtone frequencies as high as 75 MHz. In the circuit of FIG. 2, $R_1$ is controlled by resistors 26 and 28 and $R_2$ is controlled by resistor 30.

It is noted that the square-wave output on output lead 34 is completely isolated from the oscillator gain stage. Therefore, the following logic gates will not have any effect on the oscillator performance and DC-coupling can be used without a need for AC-coupling capacitors. The peak to peak value of the square-wave output is given by the resistance of the resistor 32 times the current through the current source 46.

In a specific embodiment for purposes of explanation, capacitances $C_1=C_2=9\pm 1$ pF. The resistor values are resistor 30=resistor 32=400 ohm and resistor 26 plus resistor 28=1.5 Kohn. The differential pair tail current is agour 4 mA. A conventional 3-GHz silicon bipolar technology is assumed for the monolithic circuit.

Crystal shunt capacitance is on the order of 5 pF. Feedback capacitors 20 and 22 can easily be put on chip using a thin-oxide capacitor layer or junction capacitors. Negative resistance is available only above 23 MHz and its magnitude is larger than 50 ohms from 35 to 70 MHz. Typical third-overtone crystals have series resistance values of 25 ohm or less. Therefore, the circuit has an excellent safety margin for reliable start-up and fundamental-mode suppression from 35 to 70 MHz. The square-wave output on output lead 34 will have an amplitude of 1.6 V peak to peak. A sinusoidal output signal is provided on output lead 36 which is isolated from the square-wave signal on output lead 34.

What has been described is a crystal oscillator circuit wherein first and second transistors are connected to form a differential pair and wherein the second transistor functions as an inverting gain stage for the oscillator. Two capacitors re provided to complete a feedback path in series with a crystal which essentially functions as an inductor. The capacitors are designed to be large enough to minimize the effect of device parasitics and small enough for monolithic implementation.

The square-wave output from the circuit is completely isolated from the oscillator gain stage, thus subsequent logic gates will not have any effect on the oscillator performance and DC-coupling can be used without a need for AC-coupling capacitors.

The described circuit can be fabricated as completely monolithic, requiring only an external crystal. The circuit inherently suppresses the fundamental frequency without a need for a tank circuit or a feedback resistor and does not influence the biasing. The circuit has a completely isolated square-wave output in addition to a sinusoidal output, and reliable high frequency operation with a third-overtone crystal is possible at frequencies from 35 MHz to 70 MHz.

Having thus described our invention what I claim as new and desire to secure as Letters Patent is:

1. A crystal controlled oscillator circuit comprising first and second transistor devices, said first and second transistor devices having emitter, collector and base electrodes, said emitter electrodes of said first and second transistor devices being connected together to a current source which in turn is connected to a source of ground potential,
   first and second resistors,
   a voltage source $V_{cc}$ connected to one side of each of said first and second resistors, said other sides of each of said first and second resistors being connected respectively to separate ones of said collector electrodes of said first and second transistor devices,
   a crystal device having a first side connected to said collector electrode of said second transistor device, and a second side of said crystal device connected to said base electrode of said second transistor device,
   a first capacitor device having one side thereof connected to the junction of said crystal device and said collector electrode of said second transistor device, and a second side of said first capacitor device connected to said source of ground potential,
   a second capacitor device having one side thereof connected to the junction of said crystal device and said base electrode of said second transistor device and a second side of said second capacitor device connected to said source of ground potential,
   said crystal device, said first and second capacitor devices and said first and second transistor devices forming an oscillator circuit for producing signals having third-overtone frequencies and fundamental mode suppression.

2. A crystal controlled oscillator circuit according to claim 1 further including a first output lead connected to the junction of said collector electrode of said first transistor device and said first resistor, and a second output lead connected to the junction of said collector electrode of said second transistor device and said second resistor,
   said signals produced by said oscillator circuit appearing across said first and second output leads as a square-wave signal and a sine wave signal, respectively, having third-overtone frequencies and fundamental mode suppression.

3. A crystal controlled oscillator circuit according to claim 2 further including third, fourth and fifth resistors each having one side connected together at a common node, the other side of said third resistor being connected to said voltage source $V_{cc}$, the other side of said fourth resistor being connected to said base electrode of said second transistor device and the other side of said fifth resistor being connected to said base electrode of said first transistor device.

4. A crystal controlled oscillator circuit according to claim 3 further including a sixth resistor and at least one diode connected in series between said common node and said source of ground potential.

* * * * *